US011968804B2

(12) United States Patent
Tung et al.

(10) Patent No.: US 11,968,804 B2
(45) Date of Patent: Apr. 23, 2024

(54) COOLING SYSTEM AND OPERATION METHOD THEREOF WHERE A SEPARATION TANK IS USED AND COOLING IS CONTROLLED ACCORDING TO PRESSURES AND TEMPERATURES

(71) Applicants: Inventec (Pudong) Technology Corp., Shanghai (CN); Inventec Corporation, Taipei (TW)

(72) Inventors: Kai-Yang Tung, Taipei (TW); Hung-Ju Chen, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 67 days.

(21) Appl. No.: 17/838,302

(22) Filed: Jun. 13, 2022

(65) Prior Publication Data

US 2023/0085497 A1 Mar. 16, 2023

(30) Foreign Application Priority Data

Sep. 14, 2021 (CN) .......................... 202111075963.4

(51) Int. Cl.
*F28D 15/02* (2006.01)
*H05K 7/20* (2006.01)
*F28D 21/00* (2006.01)

(52) U.S. Cl.
CPC ......... *H05K 7/20318* (2013.01); *F28D 15/02* (2013.01); *H05K 7/20381* (2013.01); *F28D 2021/0028* (2013.01)

(58) Field of Classification Search
CPC .. H05K 7/2029; H05K 7/20318; H05K 7/203; H05K 7/20; H05K 7/20381; H05K 7/20236; H05K 7/208; F25B 2400/23; F28D 15/02; F28D 15/0233; F28D 2021/0029; F28D 2021/0028
See application file for complete search history.

(56) References Cited

U.S. PATENT DOCUMENTS 10,966,349 B1 * 3/2021 Lau .................... H05K 7/20236

FOREIGN PATENT DOCUMENTS

JP 2009104966 A * 5/2009

* cited by examiner

*Primary Examiner* — Harry E Arant
(74) *Attorney, Agent, or Firm* — Winston Hsu

(57) ABSTRACT

A cooling system includes a tank, a heat exchanger, a separation tank, a first tube, a second tube, a third tube, a gas storage device, a fourth tube, a first valve, a second valve and a third valve. A heating element is immersed in a dielectric liquid in the tank. The heat exchanger condenses dielectric vapor of the dielectric liquid. The separation tank is used for a separation operation. The first tube is connected to the tank and the heat exchanger. The second tube is connected to the heat exchanger and the separation tank. The third tube is connected to the separation tank and the tank. The gas storage device stores the dielectric vapor. The fourth tube is connected to the gas storage device and the separation tank.

8 Claims, 6 Drawing Sheets

COOLING SYSTEM AND OPERATION METHOD THEREOF WHERE A SEPARATION TANK IS USED AND COOLING IS CONTROLLED ACCORDING TO PRESSURES AND TEMPERATURES

BACKGROUND OF THE INVENTION

1. Field of the Invention

The disclosure is related to a cooling system and an operation method for the cooling system, and more particularly, a cooling system with a separation tank and an operation method which controls cooling according to pressures and temperatures.

2. Description of the Prior Art

In a closed two-phase immersion cooling system, the control of the heat exchanger is mainly performed by controlling the temperature of a vapor side where vapor is located. By controlling the temperature of the vapor side to be close to the room temperature, the dielectric vapor is condensed, and the pressure on the vapor side is reduced. In addition, the concentration of the dielectric vapor in the mixed gas in the vapor side can be reduced to reduce leakage.

In order to improve venting and facilitate open-lid maintenance, an open cooling system can be used. For an open two-phase immersion cooling system, the dielectric vapor needs to be moved through the tube to the heat exchanger farther away before condensing inside the heat exchanger. However, since the dielectric liquid flows back to the tank in liquid form, in the open cooling system, the increase or decrease of the heat exchange amount has little effect on the dielectric vapor concentration and the temperature of the mixed gas at the vapor side of the tank. Hence, the system is often controlled according to the outlet temperature at the outlet of the heat exchanger.

In an open two-phase immersion system, for maintaining the temperature of the electronic components in the tank within a predetermined range, the pressure in the tank must be controlled close to a normal pressure to avoid changing the boiling point of the dielectric liquid due to pressure changes. However, it is difficult to control the variation of the pressure in the tank by controlling the system according to the outlet temperature of the heat exchanger, causing difficulties in the operation of the system.

SUMMARY OF THE INVENTION

An embodiment provides a cooling system, including a tank, a heat exchanger, a separation tank, a first tube, a second tube, a third tube, a gas storage device, a fourth tube, a first valve, a second valve and a third valve. The tank includes a first tank interface and a second tank interface, where a heating element is placed in the tank and immersed in a dielectric liquid. The heat exchanger includes a first heat exchanger interface and a second heat exchanger interface for condensing a dielectric vapor of the dielectric liquid. The separation tank includes a first separation tank interface, a second separation tank interface and a third separation tank interface, and is for performing a separation operation. The first tube is connected to the first tank interface and the first heat exchanger interface for allowing the dielectric vapor to pass through. The second tube is connected to the second heat exchanger interface and the first separation tank interface for allowing the dielectric liquid to pass through. The third tube is connected to the second separation tank interface and the second tank interface for allowing the dielectric liquid to pass though. The gas storage device includes a gas storage device interface, and is for storing the dielectric vapor. The fourth tube is connected to the gas storage device interface and the third separation tank interface. The first valve is disposed at the third separation interface. The second valve is disposed on the fourth tube. The third valve is disposed on the gas storage device interface.

An embodiment provides an operation method for a cooling system. The cooling system includes a tank for immersing a heating element in a dielectric liquid, a heat exchanger for condensing a dielectric vapor of the dielectric liquid, a separation tank, a gas storage device, a first tube connected to the tank and the heat exchanger, a second tube connected to the heat exchanger and the separation tank, a third tube connected to the separation tank and the tank, a fourth tube connected to a gas storage interface of the gas storage device and a separation tank interface of the separation tank, a first valve disposed at the separation tank interface, a second valve disposed on the fourth tube, and a third value disposed at the gas storage device interface. The operation method includes controlling the first valve, the second valve and the third valve to perform a degassing operation to release the dielectric vapor to the gas storage device and/or an ambient environment when a first hydraulic pressure measured at a bottom of the tank exceeds a first upper threshold, and a second hydraulic pressure measured at a bottom of the separation tank exceeds a second upper threshold.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
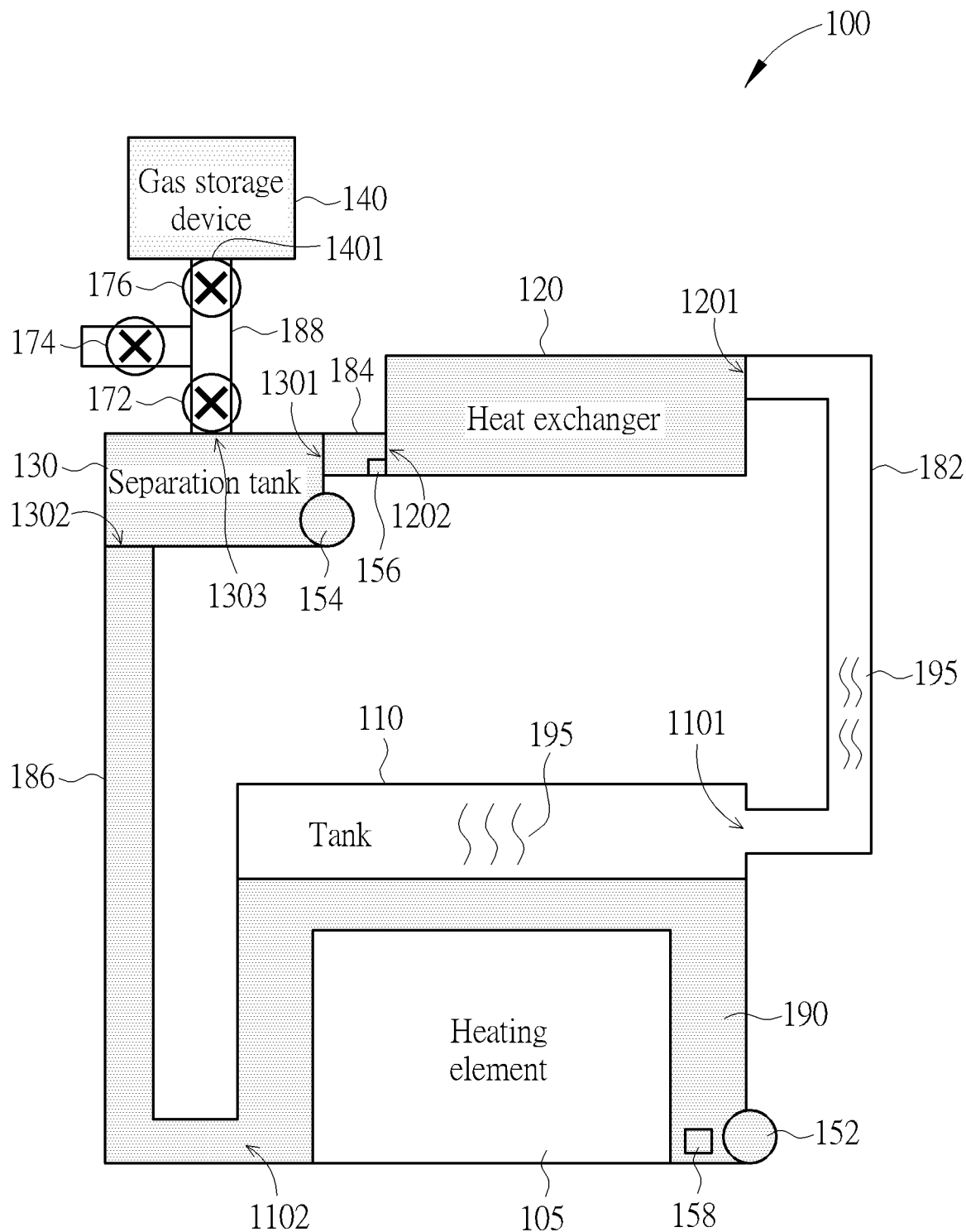
FIG. 1 illustrates a cooling system according to an embodiment.

FIG. 1 illustrates a cooling system 100 according to an embodiment. The cooling system 100 can include a tank 110, a heat exchanger 120, a separation tank 130, a first tube 182, a second tube 184, a third tube 186, a gas storage device 140, a fourth tube 188, a first valve 172, a second valve 174 and a third valve 176. The tank 110 can include a first tank interface 1101 and a second tank interface 1102, where a heating element 105 can be placed in the tank 110 and immersed in a dielectric liquid 190, and the dielectric liquid 190 can be condensate. The heat exchanger 120 can include a first heat exchanger interface 1201 and a second heat exchanger interface 1202, and be used to condense dielectric vapor 195 of the dielectric liquid 190. The separation tank 130 can include a first separation tank interface 1301, a second separation tank interface 1302 and a third separation tank interface 1303, and be used to perform a separation operation described below. The first tube 182 can be connected to the first tank interface 1101 and the first heat exchanger interface 1201, and be used to allow the dielectric vapor 195 to pass through. The second tube 184 can be connected to the second heat exchanger interface 1202 and the first separation tank interface 1301, and be used to allow the dielectric liquid 190 to pass through. The third tube 186 can be connected to the second separation tank interface 1302 and the second tank interface 1102, and be used to allow the dielectric liquid 190 to pass though. The gas storage device 140 can include a gas storage device interface 1401, and be used to store the dielectric vapor 195. In addition to the dielectric vapor 195, the gas storage device 140 can also store the air in the cooling system 100, so the gas storage device 140 can store the mixed gas of the dielectric vapor 195 and the air in the cooling system 100. The fourth tube 188 can be connected to the gas storage device interface 1401 and the third separation tank interface 1303. The first valve 172 and the third valve 176 can be disposed at the two ends of the fourth tube 188, where the first valve 172 can be disposed at the third separation tank interface 1303, and third valve 176 can be disposed on the gas storage device interface 1401. The second valve 174 can be disposed on the fourth tube 188 and between an ambient environment and the interior of the cooling system 100.

As shown in FIG. 1, the cooling system 100 can further include first manometer 152, a second manometer 154, a first thermometer 156 and a second thermometer 158. The first manometer 152 can be disposed at the bottom of the tank 110 for measuring a first hydraulic pressure (denoted as P1 in the text) generated by the dielectric liquid 190. The second manometer 154 can be disposed at the bottom of the separation tank 130 and at a side closer to the heat exchanger 120 for measuring a second hydraulic pressure (denoted as P2 in the text) generated by the dielectric liquid 190. The first thermometer 156 can be disposed at the second heat exchanger interface 1202 for measuring a temperature (denoted as Tout in the text). The temperature Tout can be the outlet temperature of the heat exchanger 120. The second thermometer 158 can be disposed in the tank 110 for measuring a temperature (denoted as T_tank in the text) of the dielectric liquid 190 in the tank 110.

Figure 2:
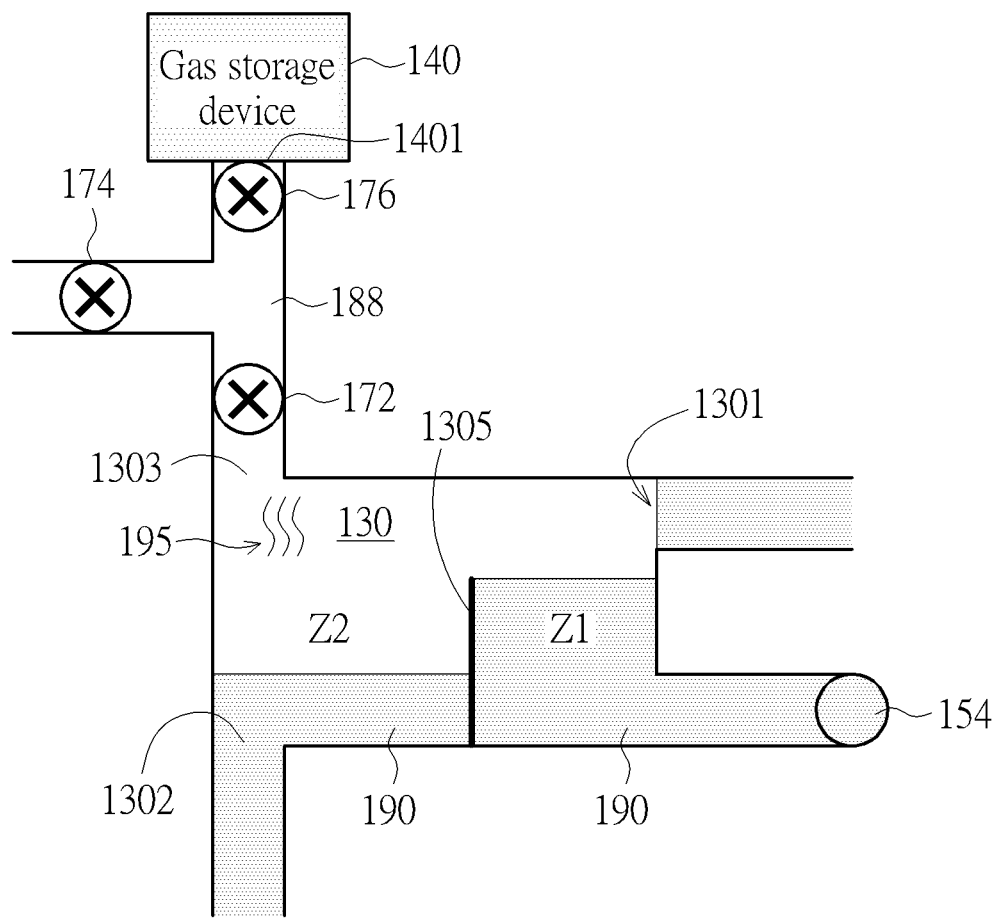
FIG. 2 illustrates a partial cross-sectional view of the cooling system in FIG. 1.

FIG. 2 illustrates a partial cross-sectional view of the cooling system 100 in FIG. 1. As shown in FIG. 2, the separation tank 130 can further include a partition 1305. The partition 1305 can be disposed at the bottom of the separation tank 130 without touching the top of the separation tank 130 for separating the separation tank 130 into a first portion Z1 and a second portion Z2.

The bottom of the second portion Z2 can be connected to the second separation tank interface 1302, and the second manometer 154 can be disposed at the bottom of the first portion Z1. The separation operation performed by the separation tank 130 can include the dielectric liquid 190 flowing into the first portion Z1 from the first separation tank interface 1301, and the dielectric liquid 190 flowing into the second portion Z2 when the liquid level of dielectric liquid 190 in the first portion Z1 reaches the top of the partition 1305.

As shown in FIG. 1 and FIG. 2, for controlling the flow of the dielectric liquid 190 and the dielectric vapor 195, the height and position of each interface can be determined. The first tank interface 1101 can be higher than the second tank interface 1102. The first heat exchanger interface 1201 can be higher than the first tank interface 1101. The first heat exchanger interface 1201 can be higher than the second heat exchanger interface 1202. The first separation tank interface 1301 can be higher than the second separation tank interface 1302. The third separation tank interface 1303 can be higher than the second separation tank interface 1302. The second separation tank interface 1302 can be higher than the second tank interface 1102.

In order to avoid measurement errors, each manometer measures the hydraulic pressure of the section where the liquid is located. Taking the first manometer 152 in FIG. 1 as an example, by disposing the first manometer 152 in the dielectric liquid 190 in the tank 110, the membrane of the first manometer 152 can be completely located in the dielectric liquid 190 to avoid measurement errors caused by the membrane contacting the vapor and the condensed droplets at the same time.

Because the tank 110 and the heat exchanger 120 are separated by a distance, the second manometer 154 can be placed below the outlet of the heat exchanger 120 (i.e. first separation tank interface 1301). Similar to the first manometer 152, for avoiding the impact of the condensed droplets to the measured result, the second manometer 154 can be completely placed in the dielectric liquid 190. In order to completely immerse the second manometer 154 in the dielectric liquid 190, the separation tank 130 is installed at the outlet of the heat exchanger 120. The separation tank 130 can be a gas-liquid separation tank, and its internal structure can be as shown in FIG. 2. The first portion Z1 is located upstream and closer to the heat exchanger 130, and the second portion Z2 located downstream and closer to the tank 110. The dielectric liquid 190 flowing out of the heat exchanger 120 can accumulate in the first portion Z1 first, so that the membrane of the second manometer 154 is completely immersed in the dielectric liquid 190. As the dielectric liquid 190 continues to flow into the separation tank 130 from the heat exchanger 120, the liquid level in the first portion Z1 can reach the top of the partition 1305, and the dielectric liquid 190 can overflow the partition 1305, flow into the second portion Z2, and then flow back to the tank 110 through the third tube 186.

For controlling the internal pressure of the cooling system 100, a pressure control device formed by the gas storage device 140, the first valve 172 to the third valve 176 and the fourth tube 188 can be used. The pressure control device can be connected to the top of the second portion Z2 to prevent the dielectric liquid 190 from flowing into the pressure control device due to the change of the liquid level, resulting in the loss of the dielectric liquid 190.

Figure 3:
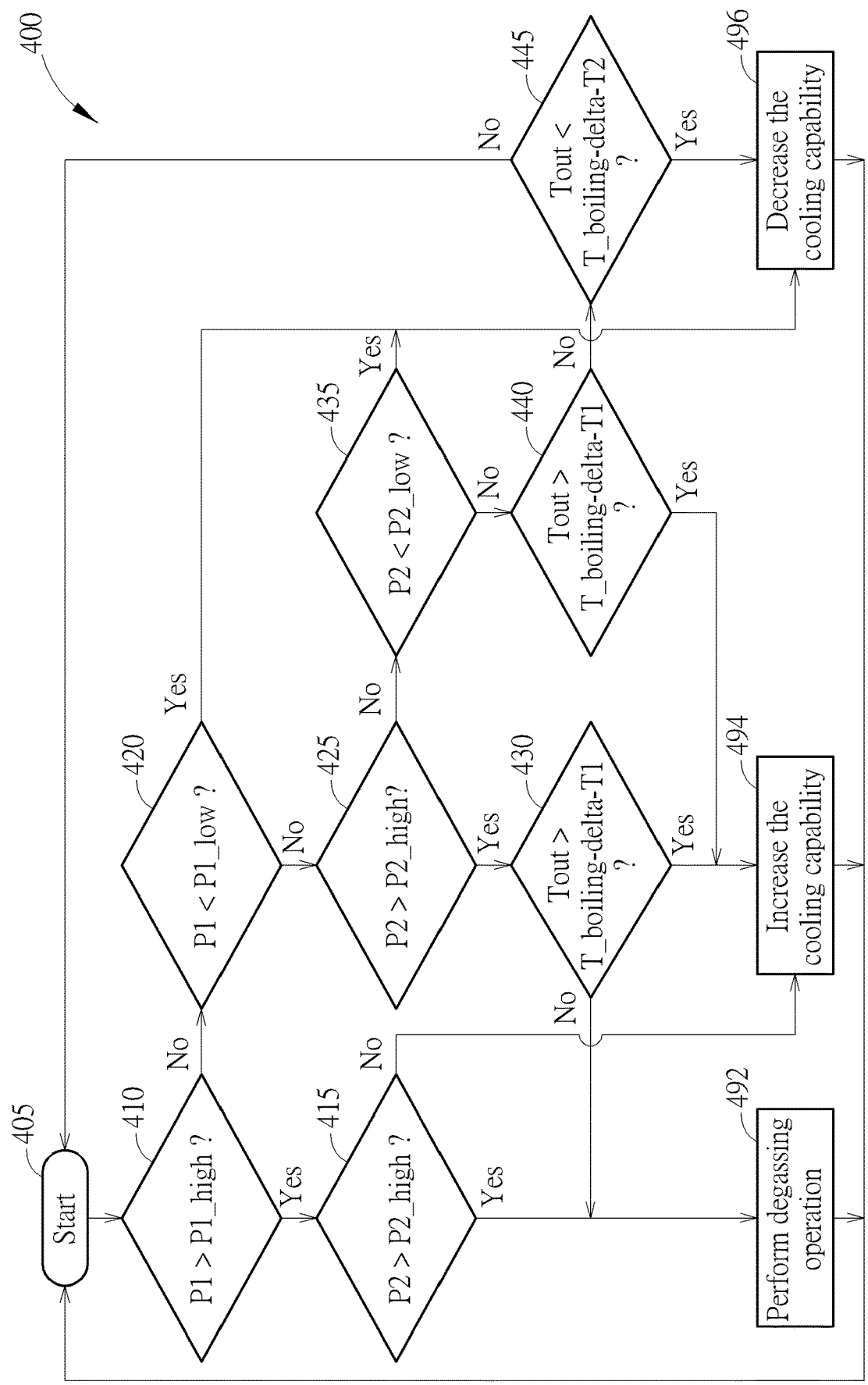
FIG. 3 illustrates an operation method for the cooling system in FIG. 1.

FIG. 3 illustrates an operation method 400 for the cooling system 100 in FIG. 1. The operation method 400 can include the following steps.

Step 405: start;
Step 410: determine if the first hydraulic pressure P1 exceeds a first upper threshold (denoted as P1_high in the text); if so, enter Step 415; otherwise, enter Step 420;
Step 415: determine if the second hydraulic pressure P2 exceeds a second upper threshold (denoted as P2_high in the text); if so, enter Step 492; otherwise, enter Step 494;
Step 420: determine if the first hydraulic pressure P1 is lower than a first lower threshold (denoted as P1_low in the text); if so, enter Step 496; otherwise, enter Step 425;
Step 425: determine if the second hydraulic pressure P2 exceeds the second upper threshold P2_high; if so, enter Step 430; otherwise, enter Step 435;

Step 430: determined if the abovementioned temperature Tout exceeds an upper threshold temperature (denoted as T_boiling-delta-T1 in the text); if so, enter Step 494; otherwise, enter Step 492;

Step 435: determine if the second hydraulic pressure P2 is lower than a second lower threshold (denoted as P2_low in the text); if so, enter Step 496; otherwise, enter Step 440;

Step 440: determined if the temperature Tout exceeds the upper threshold temperature T_boiling-delta-T1; if so, enter Step 494; otherwise, enter Step 445;

Step 445: determined if the temperature Tout is lower than a lower threshold temperature (denoted as T_boiling-delta-T2 in the text); if so, enter Step 496; otherwise, enter Step 405;

Step 492: control the first valve 172, the second valve 174 and the third valve 176 to perform a degassing operation to release the dielectric vapor 195 to the gas storage device 140 and/or an ambient environment; enter Step 405;

Step 494: increase the cooling capability of the heat exchanger 120; enter Step 405;

Step 496: decrease the cooling capability of the heat exchanger 120; enter Step 405.

The operation method 400 in FIG. 3 includes a control flow operated with regarding the first hydraulic pressure P1, the second hydraulic pressure P2 and the temperature Tout measured at the outlet of the heat exchanger 120. Step 410 to Step 425 and Step 435 are used to determine whether the first hydraulic pressure P1 and the second hydraulic pressure P2 are within predetermined ranges. The predetermined range for the first hydraulic pressure P1 can be between the first upper threshold P1_high and the first lower threshold P1_low. The predetermined range for the second hydraulic pressure P2 can be between the second upper threshold P2_high and the second lower threshold P2_low. Step 430, Step 440 and Step 445 are used to determine whether the temperature Tout is within a predetermined range.

The predetermined range of the temperature Tout can be the range of the boiling point temperature of the dielectric liquid 190, that is, the range between the upper threshold temperature T_boiling-delta-T1 and the lower threshold temperature T_boiling-delta-T2. The first upper threshold P1_high is higher than the first lower threshold P1_low. The second upper threshold P2_high is higher than the second lower threshold P2_low. The upper threshold temperature T_boiling-delta-T1 is higher than the lower threshold temperature T_boiling-delta-T2. It can be expressed as P1_high>P1_low, P2_high>P2_low, and T_boiling-delta-T1>T_boiling-delta-T2.

If the first hydraulic pressure P1 and the second hydraulic pressure P2 are higher than the first upper threshold P1_high and the second upper threshold P2_high respectively (i.e. P1>P1_high and P2>P2_high), the amount of gas in the cooling system 100 is excessive, and the degassing operation can be performed. Hence, if the result of Step 415 is "yes", the flow can enter Step 492 to perform the degassing operation.

If the first hydraulic pressure P1 is higher than the first upper threshold P1_high, and the second hydraulic pressure P2 is lower than the second upper threshold P2_high (i.e. P1>P1_high and P2<P2_high), the cooling capability of the heat exchanger 120 is insufficient, and the cooling capability can be increased. Hence, if the result of Step 415 is "no", the flow can enter Step 494 to increase the cooling capability.

If the first hydraulic pressure P1 and the second hydraulic pressure P2 are lower than the first lower threshold P1_low and the second lower threshold P2_low respectively (i.e. P1<P1_low and P2<P2_low), the amount of gas in the cooling system 100 is insufficient. Hence, the flow can enter Step 496 to decrease the cooling capacity for increasing the amount of gas. If the first hydraulic pressure P1 is lower than the first lower threshold P1_low, and the second hydraulic pressure P2 exceeds the second lower threshold P2_low (i.e. P1<P1_low and P2>P2_low), the cooling capacity of the heat exchanger 120 is excessive, and the flow can enter Step 496 to decrease the cooling capacity. For simplifying the flow, as shown in Step 420, when the first hydraulic pressure is lower than the first lower threshold P1_low (i.e. P1<P1_low), the flow can directly enter Step 496 to decrease the cooling capacity without checking the second hydraulic pressure P2.

As shown in Step 435 to Step 445, when the first hydraulic pressure P1 is between the first lower threshold P1_low and the first upper threshold P1_high (i.e. P1_low<P1<P1_high), the state of the cooling system 100 can be determined according to the second hydraulic pressure P2 and the temperature Tout.

When the second hydraulic pressure P2 and the temperature Tout exceed the second upper threshold P2_high and the upper threshold temperature T_boiling-delta-T1 respectively (i.e. P2>P2_high and Tout>T_boiling-delta-T1), the amount of heat exchange of the cooling system 100 is insufficient, so the flow can enter Step 494 to increase the cooling capacity.

When the second hydraulic pressure P2 exceeds the second upper threshold P2_high, and the temperature Tout is lower than the upper threshold temperature T_boiling-delta-T1 (i.e. P2>P2_high and Tout<T_boiling-delta-T1), the amount of the uncondensed vapor in the cooling system 100 is excessive, and the flow can enter Step 492 to perform the degassing operation for increase the cooling efficiency of the heat exchanger 120.

When the second hydraulic pressure P2 and the temperature Tout are lower than the second lower threshold P2_low and the lower threshold temperature T_boiling-delta-T2 respectively (i.e. P2<P2_low and Tout<T_boiling-delta-T2), the amount of heat exchange of the cooling system 100 is excessive, and the flow can enter Step 496 to decrease the cooling capacity. When the second hydraulic pressure P2 is lower than the second lower threshold P2_low, and the temperature Tout is higher than lower threshold temperature T_boiling-delta-T2 (i.e. P2<P2_low and Tout>T_boiling-delta-T2), the amount of the uncondensed vapor in the cooling system 100 is insufficient, so the cooling efficiency of the heat exchanger 120 is too high, and the flow can enter Step 496 to decrease the cooling capacity. For simplifying the flow, when the second hydraulic pressure P2 is lower than the second lower threshold P2_low (i.e. P2<P2_low), the flow can directly enter Step 496 to decrease the cooling capacity of the heat exchanger 120 without checking the temperature Tout.

When the first hydraulic pressure P1 and the second hydraulic pressure P2 are within the predetermined ranges (i.e. P1_high>P1>P1_low and P2_high>P2>P2_low), the amount of gas in the cooling system 100 is normal, and the temperature Tout can be checked to determine if the cooling capacity of the heat exchanger 120 needs to be adjusted. As shown in Step 440 and Step 445, if the temperature Tout is higher than the upper threshold temperature T_boiling-delta-T1 (i.e. Tout>T_boiling-delta-T1), the flow can enter Step 494 to increase the cooling capacity. When the temperature Tout is lower than the lower threshold temperature T_boiling-delta-T2 (Tout<T_boiling-delta-T2), the flow can enter Step 496 to decrease the cooling capacity. When the temperature Tout is between the upper threshold temperature T_boiling-delta-T1 and the lower threshold temperature T_boiling-delta-T2 (i.e. T_boiling-delta-T1>T1>T_boiling-delta-T2), the cooling capacity of the heat exchanger 120 may not be adjusted.

After each of Step 492, Step 494 and Step 496 is completed, the flow can be ended or enter Step 405 to perform the flow in FIG. 3 again.

Figure 4:
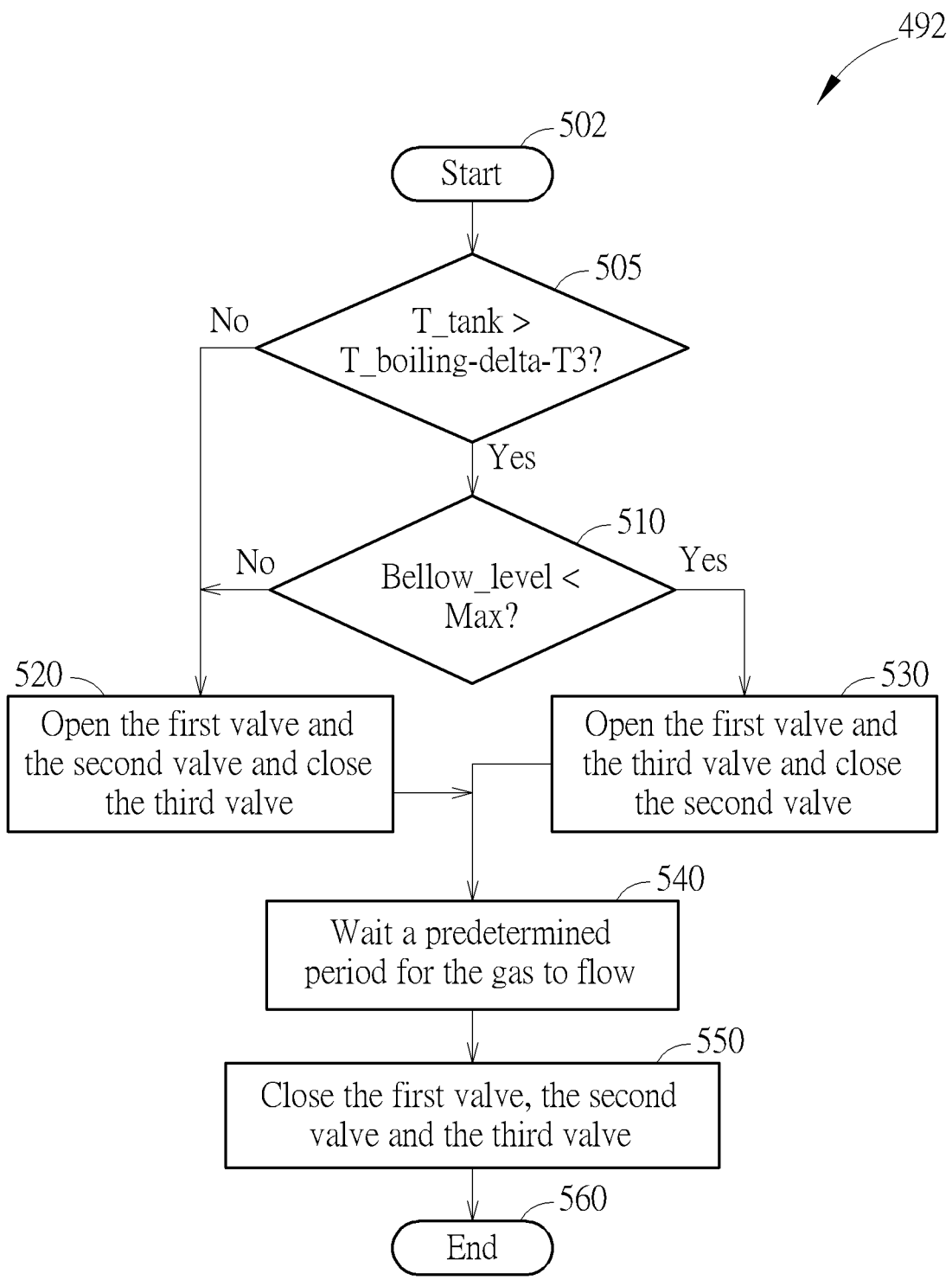
FIG. 4 illustrates a flowchart of the degassing operation in FIG. 3.

FIG. 4 illustrates a flowchart of the degassing operation of the Step 492 in FIG. 3. As shown in FIG. 1, FIG. 2 and FIG. 4, the degassing operation can include the following steps.

Step 502: start;

Step 505: determine whether the temperature T_tank of the dielectric liquid 190 in the tank 110 exceeds the predetermined temperature (denoted as T_boiling-delta-T3 in the text); if so, enter 510; otherwise, enter 520;

Step 510: determine whether the amount of the stored gas (denoted as Bellow_level in the text) of the gas storage device 140 is lower than a maximum (denoted as Max in the text); if so, enter Step 530; otherwise, enter Step 520;

Step 520: open the first valve 172 and the second valve 174, and close the third valve 176; enter Step 540;

Step 530: open the first valve 172 and the third valve 176, and close the second valve 174;

Step 540: wait a predetermined period for the gas to flow; and

Step 550: close the first valve 172, the second valve 174 and the third valve 176;

Step 560: end.

The predetermined temperature T_boiling-delta-T3 in Step 505 can be slightly lower than the boiling point of the dielectric liquid 190. In the flow in FIG. 4, when the temperature T_tank of the dielectric liquid 190 in the tank 110 exceeds the predetermined temperature T_boiling-delta-T3 (i.e. T_tank>T_boiling-delta-T3 in Step 505), the liquid temperature in the tank 110 is already stable, and the concentration of the dielectric vapor 190 is relatively high in the mixed gas. For reducing the loss of the dielectric liquid 190, when the gas storage device 140 is not full (i.e. Bellow_level<Max), the first valve 172 and the third valve 176 can be opened and the second valve 174 can be closed, so that the mixed gas can flow into the gas storage device 140. When the temperature T_tank of the dielectric liquid 190 in the tank 110 is lower than the predetermined temperature T_boiling-delta-T3 (i.e. T_tank<T_boiling-delta-T3 in Step 505), it can be determined the concentration of the dielectric vapor 190 is relatively low, so the first valve 172 and the second valve 174 can be opened and the third valve 176 can be closed to allow the mixed gas to flow from the interior of the cooling system 100 to the ambient environment. In addition, when the gas storage device 140 is full, the first valve 172 and the second valve 174 can be opened and the third valve 176 can be closed to allow the mixed gas flow from the interior of the cooling system 100 to the ambient environment. In Step 540, after the valves has been opened for the predetermined period (e.g. several seconds), all three valves can be closed to isolate the interior of the cooling system 100 from the ambient environment and complete the degassing operation.

Figure 5:
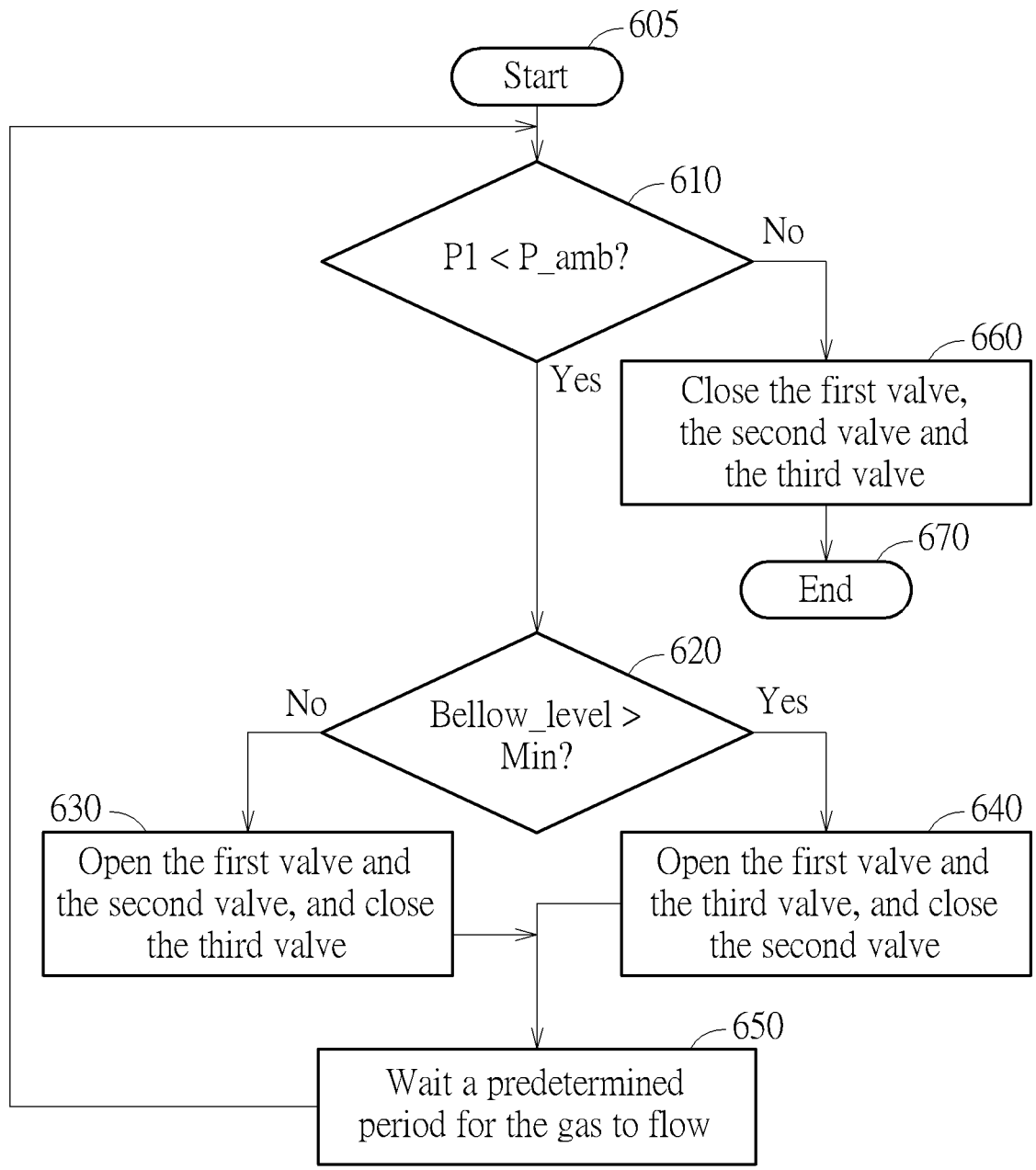
FIG. 5 illustrates a flowchart of a suction operation for the cooling system in FIG. 1.

FIG. 5 illustrates a flowchart of a suction operation for the cooling system 100 in FIG. 1. As shown in FIG. 5, the suction operation can include following steps.

Step 605: start;

Step 610: determine if the first hydraulic pressure P1 is lower than a predetermined pressure (denoted as P_amb in the text); if so, enter Step 620; otherwise, enter Step 660;

Step 620: determine whether the amount of the stored gas Bellow_level of the gas storage device 140 exceeds a minimum (denoted as Min in the text); if so, enter Step 640; otherwise, enter Step 630;

Step 630: open the first valve 172 and the second valve 174, and close the third valve 176; enter Step 650;

Step 640: open the first valve 172 and the third valve 176, and close the second valve 174;

Step 650: wait a predetermined period for the gas to flow; enter Step 610;

Step 660: close the first valve 172, the second valve 174 and the third valve 176; and Step 670: end.

The cooling system 100 may be in a state of negative pressure. For example, in Step 610, if the first hydraulic pressure P1 is lower than the predetermined pressure P_amb (e.g. P1<P_amb), the cooling system 100 can be in the state of negative pressure. In the state of negative pressure, the tank 110 can be compressed due to the pressure difference inside and outside the tank 110, and the cooling system 100 can be better sealed. However, if the tank 110 is to be opened for maintenance, more force is required to resist the pressure difference to open a lid of the tank 110. In order to open the lid more easily, before opening the lid, the suction operation in FIG. 5 can be performed to increase the pressure inside the cooling system 100. In order to retrieve the dielectric vapor 195 in the mixed gas as much as possible, if the gas storage device 140 still has some gas to vent (i.e. bellow_level>Min), the flow can enter Step 640, so that the mixed gas in the gas storage device 140 can flow back to the fourth tube 188. If the gas storage device 140 has no gas to vent (i.e. the result of Step 620 is "no"), the flow can enter Step 630 to draw air from the ambient environment. After opening the valves for the predetermined period in Step 650, the flow can enter Step 610 to determine whether the pressure in the cooling system 100 has returned to the normal pressure. If the pressure in the cooling system 100 has not returned to the normal pressure (i.e. the result of Step 610 is "yes"), the flow can enter Step 620. If the result of Step 610 is "no", the flow can enter Step 660 to close the three valves to isolate the interior of the cooling system 100 from the ambient environment and complete the suction operation.

Figure 6:
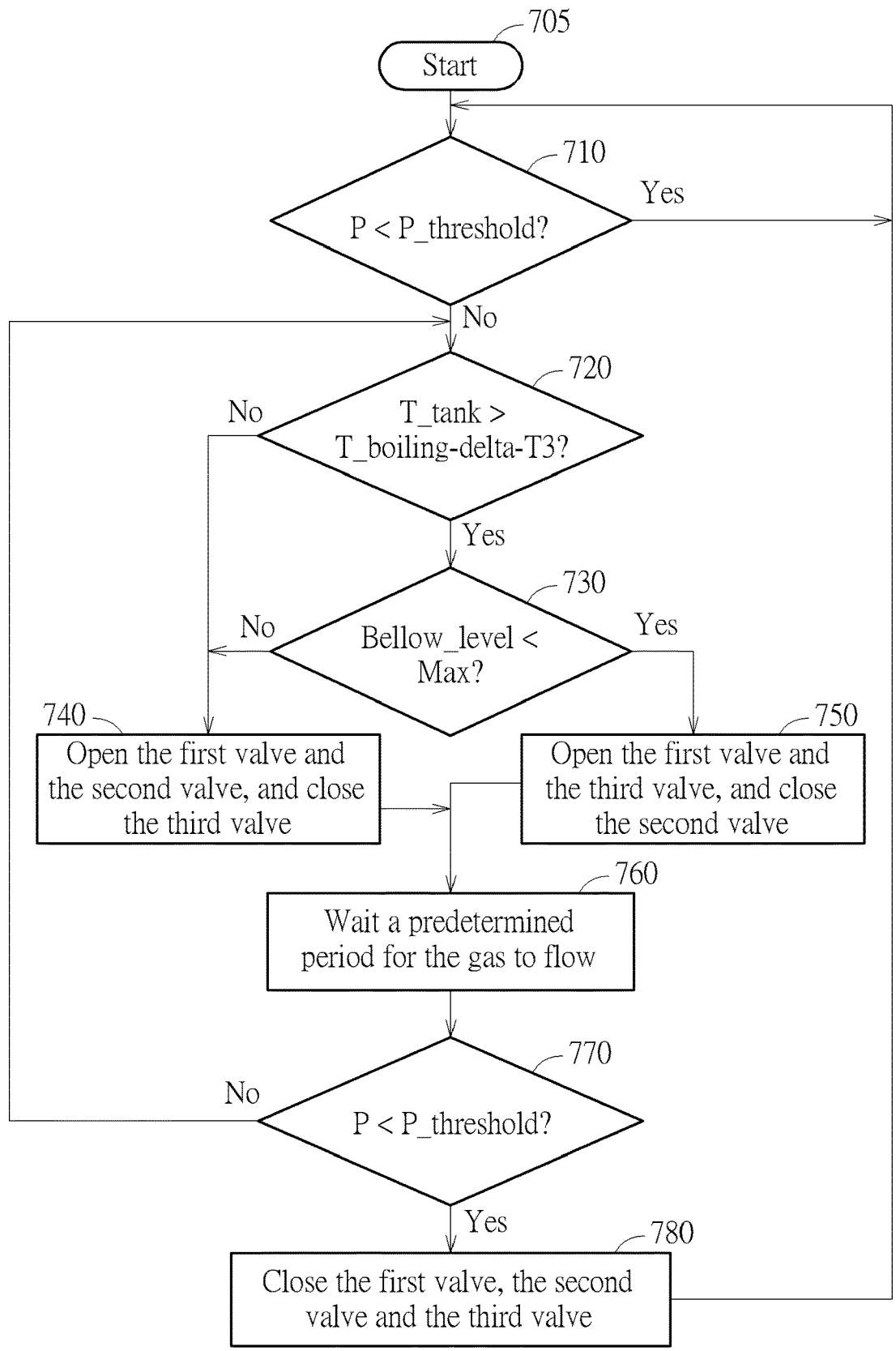
FIG. 6 illustrates a flowchart of an over-pressure protection operation for the cooling system in FIG. 1.

FIG. 6 illustrates a flowchart of an over-pressure protection operation for the cooling system 100 in FIG. 1. As shown in FIG. 6, the over-pressure protection operation can include the following steps.

Step 705: start;

Step 710: determine whether the pressure (denoted as Pin the text) in the cooling system 100 is lower than a threshold (denoted as P_threshold in the text); if so, enter Step 705; otherwise, enter Step 720;

Step 720: determine whether the temperature T_tank of the dielectric liquid 190 in the tank 110 exceeds the predetermined temperature T_boiling-delta-T3; if so, enter Step 730; otherwise, enter Step 740;

Step 730: determine whether the amount of the stored gas Bellow_level of the gas storage device 140 is lower than a maximum Max; if so, enter Step 750; otherwise, enter Step 740;

Step 740: open the first valve 172 and the second valve 174, and close the third valve 176; enter Step 760;

Step 750: open the first valve 172 and the third valve 176, and close the second valve 174;

Step 760: wait a predetermined period for the gas to flow;

Step 770: determine whether the pressure P in the cooling system 100 is lower than the threshold P_threshold; if so, enter Step 780; otherwise, enter Step 720; and Step 780: close the first valve 172, the second valve 174 and the third valve 176; enter Step 710.

In the over-pressure protection operation shown in FIG. 6, the pressure Pin Step 710 and 770 can be the first hydraulic pressure P1 or second hydraulic pressure P2 mentioned above. When the pressure P exceeds the threshold P_threshold (i.e. P>P_threshold), the amount of gas in the cooling system 100 is excessive. In order to avoid damage caused by excessive pressure inside the cooling system 100, excessive gas can be vented, hence the flow in FIG. 6 can be similar to the degassing operation. When the temperature T_tank of the dielectric liquid 190 in the tank 110 has stabilized (i.e. T_tank>T_boiling-delta-T3), the first valve 172, the second valve 174 and the third valve 176 can be controlled according to the amount of available space in the gas storage device 140 in Step 730, Step 740 and Step 750, so that the gas can be kept in the gas storage device 140 or vented out of the cooling system 100. If the temperature T_tank of the liquid in the tank 110 is lower than the predetermined temperature T_boiling-delta-T3 in Step 720, the flow can enter Step 740 to vent the gas. It can be checked whether the pressure P is lower than the threshold P_threshold at regular intervals, and the first valve 172 to the third valve 176 can be controlled again according to the temperature T_tank and the amount of available space in the gas storage device 140 as mentioned above. The over-pressure protection operation in FIG. 6 can be performed until the pressure P is lower than the threshold P_threshold, and then the first valve 172 to the third valve 176 can be closed to isolate the interior of the cooling system 100 from the ambient environment. After Step 780, the flow in FIG. 6 can be ended or enter Step 710 to perform controls and checks related to the over-pressure protection. By performing the over-pressure protection operation in FIG. 6, damage to the cooling system 100 caused by high pressure can be avoided, and the boiling point of the dielectric liquid 190 can be prevented from rising.

In summary, the cooling system 100, the operation method 400, the degassing operation, the suction operation, and the over-pressure protection operation provided by embodiments can be performed according to the pressure and temperature, so the pressure in the cooling system 100 is effectively and appropriately controlled. As a result, problems such as changes in boiling point of the dielectric liquid 190, damage caused by over-pressure, and difficulty of open-lid maintenance are effectively dealt with.

The cooling system 100 and the operation method 400 provided by embodiments can help to cool the server and related devices, so as to improve the stability and reliability of the server and related devices, and make the server and related devices more suitable for artificial intelligence (AI) computing and edge computing. The cooling system 100 and the operation method 400 are also helpful for applications such as 5G communication servers, cloud servers, and Vehicle-to-everything (V2X) servers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cooling system, comprising:
a tank comprising a first tank interface and a second tank interface, wherein a heating element is placed in the tank and immersed in a dielectric liquid;
a heat exchanger comprising a first heat exchanger interface and a second heat exchanger interface, and configured to condense a dielectric vapor of the dielectric liquid;
a separation tank comprising a first separation tank interface, a second separation tank interface and a third separation tank interface, and configured to perform a separation operation;
a first tube connected to the first tank interface and the first heat exchanger interface, and configured to allow the dielectric vapor to pass through;
a second tube connected to the second heat exchanger interface and the first separation tank interface, and configured to allow the dielectric liquid to pass through;
a third tube connected to the second separation tank interface and the second tank interface, and configured to allow the dielectric liquid to pass though;
a gas storage device comprising a gas storage device interface, and configured to store the dielectric vapor;
a fourth tube connected to the gas storage device interface and the third separation tank interface;
a first valve disposed at the third separation tank interface;
a second valve disposed on the fourth tube;
a third valve disposed on the gas storage device interface;
a first manometer disposed at a bottom of the tank, and configured to measure a first hydraulic pressure;
a second manometer disposed at a bottom of the separation tank, and configured to measure a second hydraulic pressure;
a first thermometer disposed at the second heat exchanger interface, and configured to measure a temperature; and
a second thermometer disposed in the tank, and configured to measure a temperature of the dielectric liquid.

2. The cooling system of claim 1, wherein the separation tank further comprises:
a partition disposed at the bottom of the separation tank without touching a top of the separation tank, and configured to separate the separation tank into a first portion and a second portion;
wherein a bottom of the second portion is connected to the second separation tank interface, the second manometer is disposed at a bottom of the first portion; and
the separation operation comprises the dielectric liquid flowing into the first portion from the first separation tank interface, and the dielectric liquid flowing into the second portion when a liquid level of dielectric liquid in the first portion reaches a top of the partition.

3. The cooling system of claim 1, wherein:
the first tank interface is higher than the second tank interface;
the first heat exchanger interface is higher than the first tank interface;
the first heat exchanger interface is higher than the second heat exchanger interface;
the first separation tank interface is higher than the second separation tank interface;
the third separation tank interface is higher than the second separation tank interface; and
the second separation tank interface is higher than the second tank interface.

4. An operation method for a cooling system, the cooling system comprising a tank for immersing a heating element in a dielectric liquid, a heat exchanger for condensing a dielectric vapor of the dielectric liquid, a separation tank, a gas storage device, a first tube connected to the tank and the heat exchanger, a second tube connected to the heat exchanger and the separation tank, a third tube connected to the separation tank and the tank, a fourth tube connected to a gas storage interface of the gas storage device and a separation tank interface of the separation tank, a first valve disposed at the separation tank interface, a second valve disposed on the fourth tube, and a third valve disposed at the gas storage device interface, the operation method comprising:

controlling the first valve, the second valve and the third valve to perform a degassing operation to release the dielectric vapor to the gas storage device and/or an ambient environment when a first hydraulic pressure measured at a bottom of the tank exceeds a first upper threshold, and a second hydraulic pressure measured at a bottom of the separation tank exceeds a second upper threshold; and increasing a cooling capability of the heat exchanger when the first hydraulic pressure is between the first upper threshold and a first lower threshold, the second hydraulic pressure exceeds the second upper threshold, and a temperature measured at a connection position of the heat exchanger and the second tube exceeds a temperature threshold.

5. The operation method for the cooling system of claim 4, further comprising:

decreasing the cooling capability of the heat exchanger when the first hydraulic pressure is lower than the first lower threshold.

6. The operation method for the cooling system of claim 4, further comprising:

increasing the cooling capability of the heat exchanger when the first hydraulic pressure exceeds the first upper threshold, and the second hydraulic pressure is lower than the second upper threshold.

7. The operation method for the cooling system of claim 4, further comprising:

controlling the first valve, the second valve and the third valve to perform the degassing operation when the first hydraulic pressure is between the first upper threshold and the first lower threshold, the second hydraulic pressure exceeds the second upper threshold, and the temperature measured at the connection position of the heat exchanger and the second tube is lower than the temperature threshold.

8. The operation method for the cooling system of claim 4, further comprising:

decreasing the cooling capability of the heat exchanger when the first hydraulic pressure is between the first upper threshold and the first lower threshold, and the second hydraulic pressure is lower than a second lower threshold.

* * * * *